(12) United States Patent
Kitagawa

(10) Patent No.: US 11,901,036 B2
(45) Date of Patent: Feb. 13, 2024

(54) APPARATUSES AND METHODS OF POWER SUPPLY CONTROL FOR SENSE AMPLIFIERS

(71) Applicant: MICRON TECHNOLOGY, INC., Boise, ID (US)

(72) Inventor: Katsuhiro Kitagawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 42 days.

(21) Appl. No.: 17/692,066

(22) Filed: Mar. 10, 2022

(65) Prior Publication Data
US 2023/0290386 A1    Sep. 14, 2023

(51) Int. Cl.
*G11C 7/08* (2006.01)
*G11C 8/10* (2006.01)

(52) U.S. Cl.
CPC . *G11C 7/08* (2013.01); *G11C 8/10* (2013.01)

(58) Field of Classification Search
CPC .................................. G11C 7/08; G11C 8/10

USPC ........................................................ 365/207
See application file for complete search history.

(56) References Cited

U.S. PATENT DOCUMENTS

2019/0355421 A1* 11/2019 Deguchi ............. G11C 11/5671

* cited by examiner

*Primary Examiner* — Huan Hoang
(74) *Attorney, Agent, or Firm* — Dorsey & Whitney LLP

(57) ABSTRACT

Apparatuses for controlling power supply to sense amplifiers are described. An example apparatus includes a bank. The bank includes: a first plurality of memory cells; a second plurality of memory cells; first sense amplifiers coupled to the first plurality of memory cells; second sense amplifiers coupled to the second plurality of memory cells; a first power control circuit and a coupled to the first sense amplifiers at a common power supply node; and a second power control circuit coupled to the second sense amplifiers at the common power supply node. The first and second power control circuits receive a plurality of control signals. The first and second power control circuits comprise first and second drive strengths respectively responsive to activation of a control signal of the plurality of control signals. The first drive strength and the second drive strength are different from each other.

20 Claims, 8 Drawing Sheets

| Transistor Control Signal | Mat Farthest from Row Decoder | | Mat Closest to Row Decoder | |
|---|---|---|---|---|
| | Ratio(%) | Activation Timing (ps) | Ratio(%) | Activation Timing (ps) |
| PSA1 | 50 | 0 | 30 | 0 |
| PSA2 | 25 | +200 | 35 | +200 |
| PSA3 | 25 | +400 | 35 | +400 |
| NSA1 | 50 | 0 | 30 | 0 |
| NSA2 | 25 | +200 | 35 | +200 |
| NSA3 | 25 | +400 | 35 | +400 |

FIG. 7

| Common Source Variation 1 | | | Common Source Variation 2 | | |
|---|---|---|---|---|---|
| Row Dec | Ratio(%) | Activation Timing (ps) | Row Dec | Ratio(%) | Activation Timing (ps) |
| Transistor 711 | 30 | 0 | Transistor 711 | 20 | +100 |
| Transistor 712 | 35 | +200 | Transistor 712 | 40 | +200 |
| Transistor 713 | 35 | +400 | Transistor 713 | 40 | +500 |
| Transistor 721 | 30 | 0 | Transistor 721 | 70 | 0 |
| Transistor 722 | 35 | +200 | Transistor 722 | 15 | +300 |
| Transistor 723 | 35 | +400 | Transistor 723 | 15 | +600 |

FIG. 10

APPARATUSES AND METHODS OF POWER SUPPLY CONTROL FOR SENSE AMPLIFIERS

BACKGROUND

Memory devices are structured to have one or more arrays of memory cells that are arranged, at least logically, in rows and columns. Each memory cell stores data as an electrical charge that is accessed by a digit line associated with the memory cell. A charged memory cell, when the memory cell is accessed, causes a positive change in voltage on the associated digit line, and an accessed memory cell that is not charged causes a negative change in voltage on the associated digit line. The change in voltage on the digit line may be amplified by a sense amplifier to indicate the value of the data state stored in the memory cell.

Conventional sense amplifiers are typically coupled to a pair of complementary digit lines to which a large number of memory cells are coupled. As known in the art, when memory cells are accessed, a row of memory cells are activated and sense amplifiers are used to amplify a data state for a respective column of activated memory cells by coupling each of the digit lines of the selected column to voltage supplies such that the digit lines have complementary logic levels.

Each mat, a subunit of each bank, includes power supply terminals that may provide common power supply nodes with power supply voltages through power supply transistors. In addition, a row decoder in each bank provides one or more common power supply voltages on the common power supply nodes to be shared across mats in each bank. The row decoder may provide the one or more common power supply voltages to the sense amplifiers in the mats. The sense amplifiers in a mat that is far from the row decoder may receive a power supply voltage that may be weaker than the sense amplifiers in a mat close to the row decoder, due to resistances of wirings as the common power supply nodes. The resistances may also cause delay in the power supply voltage propagation on the common power supply nodes from the row decoder to the farther sense amplifiers. To provide constant power supply voltages to the sense amplifiers throughout the mats in the same bank in a timely manner, voltage compensation according to the distance from the row decoder across the mats is desired.

BRIEF DESCRIPTION OF THE DRAWINGS

FIG. 7 is a table of a combination of drive strength ratios of transistors in the power control circuits and activation timings of control signals to the transistors in the power control circuits according to an embodiment of the disclosure.

FIG. 10 is a table of combinations drive strength ratios of transistors in the common power supply circuits and activation timings of control signals to the transistors in the common power supply circuits according to an embodiment of the disclosure.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

To provide constant power supply voltages to sense amplifiers throughout mats in a bank in a timely manner, voltage supply control according to a distance of each mat from a row decoder is provided. In particular, sense amplifiers for each mat include a combination of power supply transistors coupled between a power supply voltage source and a common power supply node of the sense amplifiers. A combination of power supply transistors are provided to sense amplifiers for each mat. One of the power supply transistors coupled to a common power supply node for a farther mat that is activated by a control signal has a drive strength that is greater than a drive strength of one of the power supply transistors coupled to a common power supply node for a closer mat that is also activated by the control signal. Another one of the power supply transistors coupled to the common power supply node for the farther mat is activated by another control signal has a drive strength that is less than a drive strength of another one of power supply transistors coupled to the common power supply node for the closer mat that is activated by the other control signal. The different control signals may be activated at different times, for example, one control signal is activated earlier than the other control signal. Consequently, the power supply transistors for the farther mat may provide power with greater drive strength to the common power supply node and the power supply transistors for the closer mat may provide power with less drive strength to the common power supply node as power is beginning to be provided. Later, power is provided by the power supply transistors with the same drive strength when the power supply voltage from the row decoder stabilizes to be constant regardless of the distance. Thus, the provision of power is controlled such that the sense amplifiers of the farther mat and the closer mat may receive a constant power supply voltage.

Figure 1:
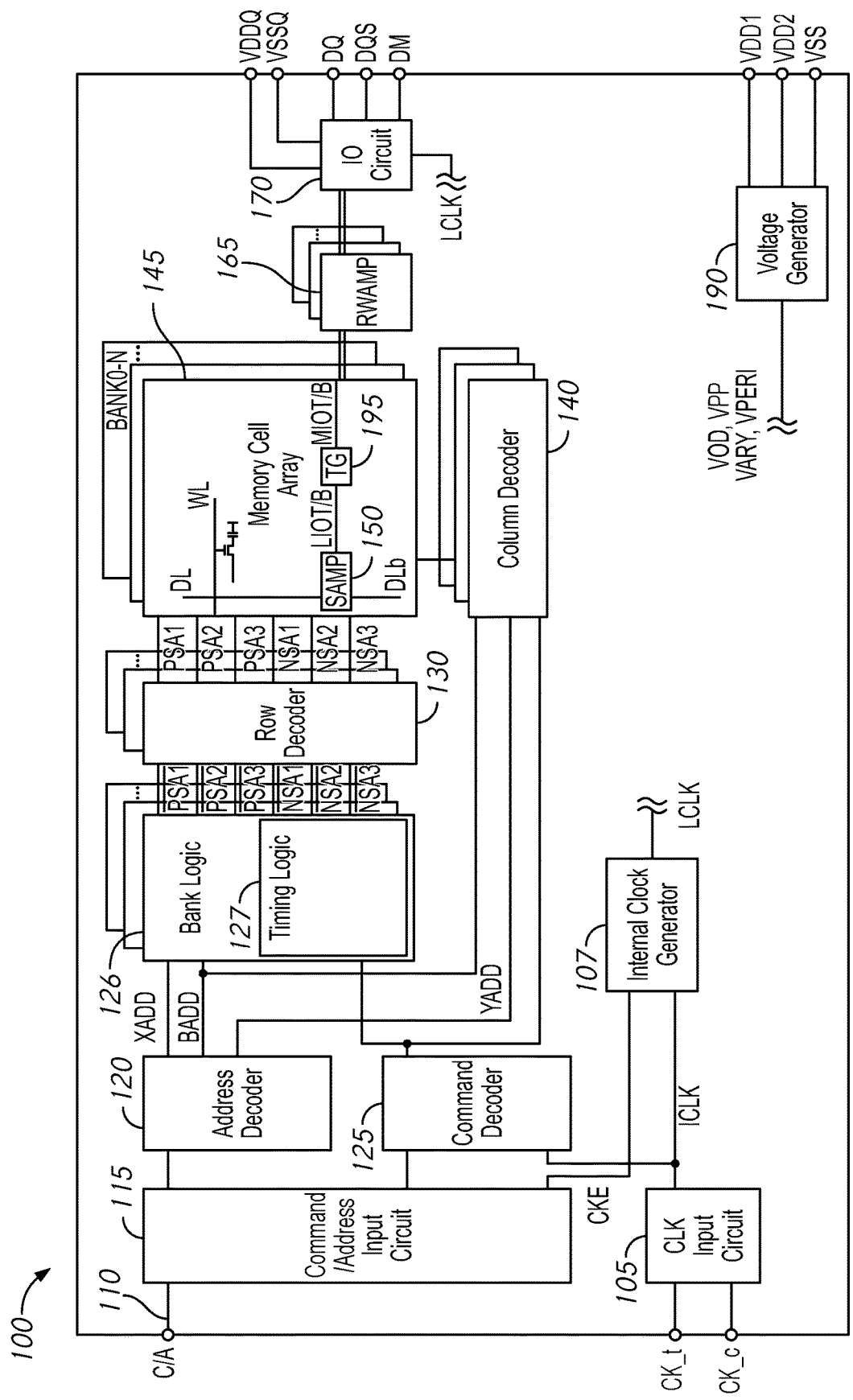
FIG. 1 is a schematic block diagram of a semiconductor memory device according to an embodiment of the disclosure.

FIG. 1 is a schematic block diagram of a semiconductor memory device 100, in accordance with an embodiment of the present disclosure. The semiconductor memory device 100 may include a clock input circuit 105, an internal clock generator 107, a command/address input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (IO) circuit 170, and a voltage generator circuit 190. The semiconductor memory device 100 may include a plurality of external terminals including command and address terminals CA coupled to command/address bus 110, clock terminals CK_t and CK_c, data terminals DQ, DQS, and DM, and power supply terminals VDD1, VDD2, VSS, VDDQ, and VSSQ. The terminals and signal lines associated with the command/address bus 110 may include common terminals and signal lines that are configured to receive both command signal and address signals. In other examples, the terminals and signal lines associated with the command and address bus 110 may include a first set of terminals and signal lines that are configured to receive the command signals and a separate, second set of terminals and signal lines that configured to receive the address signals. The semiconductor device may be mounted on a substrate, for example, a memory module substrate, a motherboard or the like. The terminals shown in FIG. 1 may include one or more separate terminals and signal lines. For example, the command and address terminals CA include seven separate terminals and signals lines in some embodiments. In an additional example, the data terminals DQ include 16 separate terminals and signal lines in some embodiments.

The memory cell array 145 includes the banks BANK0-N, where N is a positive integer, such as 3, 7, 15, 31, etc. Each bank of the banks BANK0-N may include a plurality of word lines WL, a plurality of digit lines DL and DLb, and a plurality of memory cells MC arranged at intersections of the plurality of word lines WL and the plurality of digit lines DL/DLb. The selection of the word line WL for each bank of the banks BANK0-N is performed by a corresponding row decoder 130 and the selection of the digit line DL/DLb is performed by a corresponding column decoder 140. The plurality of sense amplifiers 150 are coupled to their corresponding digit lines DL and DLb, and coupled to at least one respective local I/O line further coupled to a respective one of at least two main I/O line pairs, via transfer gates TG 195, which function as switches. The sense amplifiers 150 and transfer gates TG 195 may be operated based on control signals from decoder circuitry, which may include the command decoder 120, the row decoders 130, the column decoders 140, any control circuitry of the memory cell array 145 of the banks BANK0-N, or any combination thereof.

The command/address input circuit 115 may receive an address signal and a bank address signal from outside at the command/address terminals via the command/address bus 110 and transmit the address signal and the bank address signal to the address decoder 120. The address decoder 120 may decode the address signal received from the command/address input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The command/address input circuit 115 may receive a command signal from outside, such as, for example, a memory controller at the command/address terminals via the command/address bus 110 and provide the command signal to the command decoder 125. The command decoder 125 may decode the command signal and generate various internal command signals. The internal command signals may be used to control operation and timing of various circuits of the semiconductor memory device 100. For example, the internal command signals may include row and column command signals to control circuits to perform access operations to selected word lines and digit lines, such as a read command or a write command.

Accordingly, when activate (ACT) and read (READ) commands are issued and a row address and a column address are timely supplied with the activate and read commands, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when activate (ACT) and write commands are issued and a row address and a column address are timely supplied with the activated and write (WRITE) commands, and the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

For each bank of the banks BANK0-N, a bank logic circuit 126 may be included. The bank logic circuit 126 may allow one or more row addresses to be generated locally at each bank of the banks BANK0-N responsive to an active (ACT) command. In some embodiments, the bank logic circuit 126 may receive the internal command signals from the command decoder 125. The semiconductor memory device 100 may include a timing logic circuit 127. The timing logic circuit 127 may determine whether the internal command signal is the active (ACT) command. In some embodiments, the bank logic circuit 126 may include the timing logic circuit 127. The bank logic circuit 126 may provide control signals PSA1bar, PSA2bar, PSA3bar, NSA1bar, NSA2bar, NSA3bar to the row decoder 130, responsive to the activate command ACT. In some embodiments, the timing logic circuit 127 may control the timing of activating the control signals PSA1bar, PSA2bar, PSA3bar, NSA1bar, NSA2bar, NSA3bar in a manner that PSA1bar, PSA2bar and PSA3bar may be activated (e.g., having a falling edge) with different timings and NSA1bar, NSA2bar and NSA3bar may be activated (e.g., having a falling edge) with different timings. In some embodiments, not shown in FIG. 1, the bank logic circuit 126 including the timing logic circuit 127 may be included in the row decoder 130. In some embodiments, the row decoder 130 may invert the control signals PSA1bar, PSA2bar, PSA3bar, NSA1bar, NSA2bar, NSA3bar and provide control signals PSA1, PSA2, PSA, NSA1, NSA2, and NSA3 to the sense amplifiers 150 in the memory cell array 145.

Turning to the explanation of the external terminals included in the semiconductor device 100, the clock terminals CK_t and CK_c may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the command/address input circuit 115. Although not limited thereto, a DLL circuit may be used as the internal clock generator 107. The internal clock generator 107 may provide the phase controlled internal clock signal LCLK to the IO circuit 170. The IO circuit 170 may use the phase controller internal clock signal LCLK as a timing signal for determining an output timing of read data.

The power supply terminals may receive power supply voltages VDD1, VDD2 and VSS. These power supply voltages VDD1, VDD2 and VSS may be supplied to a voltage generator circuit 190. The voltage generator circuit 190 may generate various internal voltages VPP, VOD, VARY, VPERI, and the like based on the power supply voltages VDD1, VDD2 and VSS. The voltage VPP is mainly used in the row decoder 130, the power supply voltage VDD2 and the internal voltages VOD, and VARY are mainly used in the sense amplifiers 150 included in the memory cell array 145, and the internal voltage VPERI is used in many other circuit blocks. The IO circuit 170 may receive the power supply voltages VDDQ and VSSQ. For example, the power supply voltages VDDQ and VSSQ may be the same voltages as the power supply voltages VDD2 and VSS, respectively. However, the dedicated power supply voltages VDDQ and VSSQ may be used for the IO circuit 170.

Figure 2:
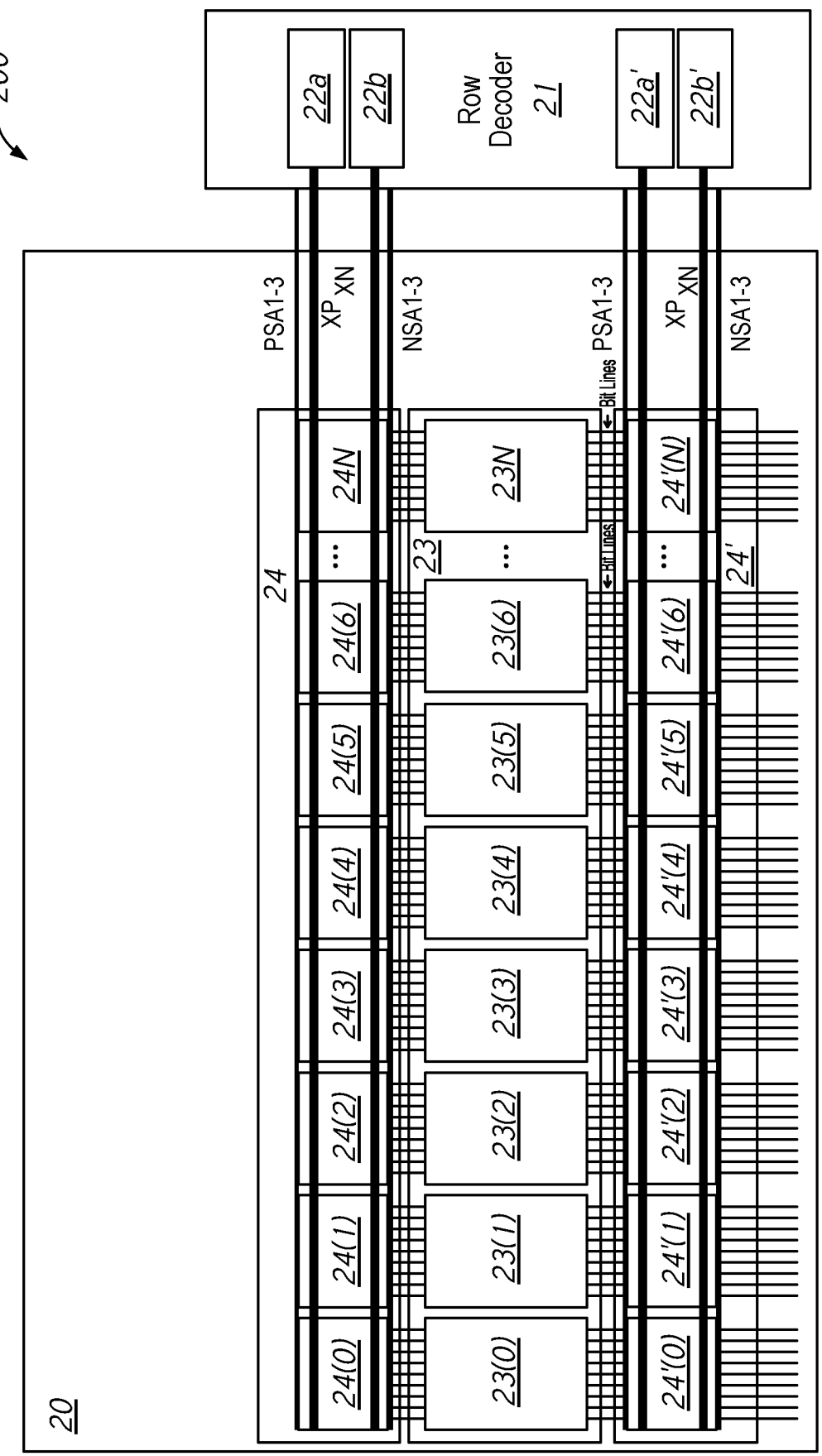
FIG. 2 is a schematic diagram of a bank and a row decoder for the bank in the semiconductor memory device according to an embodiment of the disclosure.

FIG. 2 is a schematic diagram of a bank 20 and a row decoder 21 for the bank 20 in a semiconductor memory device 200 according to an embodiment of the disclosure. In some embodiments, the bank 20 may be one of the banks BANK0-N in the memory cell array 145, and the row decoder 21 may be one of the row decoders 130.

The bank 20 may include mats 23, including mats 23(0)-23(N). In some embodiments, each mat of the mats 23(0)-23(N) may be a subunit of the bank 20. For example, each mat of the mats 23(0)-23(N) may be a core including a plurality of memory cells. In some embodiments, as shown in FIG. 2, the mat 23(0) is the farthest mat from the row decoder 21 and the mat 23(N) may be the closest mat to the row decoder 21. The bank 20 may include sense amplifier areas 24 and 24'. The sense amplifier areas 24 may include sense amplifier areas 24(0)-24(N). Each sense amplifier area of the sense amplifier areas 24(0)-24(N) may include sense amplifiers (not shown) coupled to memory cells in the mats 23(0)-23(N) respectively by bit lines for accessing data stored the memory cells. The sense amplifier areas 24' may include sense amplifier areas 24'(0)-24'(N). Each sense amplifier area of the sense amplifier areas 24'(0)-24'(N) may include sense amplifiers (not shown) coupled to memory cells in the mats 23(0)-23(N) respectively by bit lines for accessing data stored the memory cells. In some embodiments, as shown in FIG. 2, the sense amplifiers in the sense amplifier areas 24(0) and 24'(0) coupled to the mat 23(0) may be the farthest sense amplifiers from the row decoder 21, and the sense amplifiers in the sense amplifier areas 24(N) and 24'(N) may be the closest sense amplifiers to the row decoder 21.

The row decoder 21 may include common power supply circuits 22a, 22b, 22a' and 22b'. The common power supply circuits 22a and 22b may provide common power supply voltages on common power supply nodes XP and XN that may extend over the sense amplifier areas 24(0)-24(N). The common power supply circuit 22a may receive control signals PSA1-PSA3 that are provided to the sense amplifier areas 24(0)-24(N). In some embodiments, the control signals PSA1-PSA3 may be activated with different timings. In some embodiments, the control signals PSA1-PSA3 may be activated in an ascending order. For example, the control signal PSA1 may be activated first, the control signal PSA2 may be activated next, and the control signal PSA3 may be activated after the activation of the control signal PSA2. The common power supply circuit 22b may receive control signals NSA1-NSA3 that are provided to the sense amplifier areas 24(0)-24(N). In some embodiments, the control signals NSA1-NSA3 may be activated with different timings. In some embodiments, the control signals NSA1-NSA3 may be activated in an ascending order. For example, the control signal NSA1 may be activated first, the control signal NSA2 may be activated next, and the control signal NSA3 may be activated after the activation of the control signal NSA2.

Similarly, the common power supply circuits 22a' and 22b' may provide common power supply voltages on common power supply nodes XP and XN that may extend over the sense amplifier areas 24'(0)-24'(N). The common power supply circuit 22a' may receive control signals PSA1-PSA3 that are also provided to the sense amplifier areas 24'(0)-24'(N). In some embodiments, the control signals PSA1-PSA3 may be activated with different timings. In some embodiments, the control signals PSA1-PSA3 may be activated in an ascending order. For example, the control signal PSA1 may be activated first, the control signal PSA2 may be activated next, and the control signal PSA3 may be activated after the activation of the control signal PSA2. The common power supply circuit 22b' may receive control signals NSA1-NSA3 that are also provided to the sense amplifier areas 24'(0)-24'(N). In some embodiments, the control signals NSA1-NSA3 may be activated with different timings. In some embodiments, the control signals NSA1-NSA3 may be activated in an ascending order. For example, the control signal NSA1 may be activated first, the control signal NSA2 may be activated next, and the control signal NSA3 may be activated after the activation of the control signal NSA2.

Resistances of wirings of the common power supply nodes XP and XN between the row decoder 21 and the sense amplifier areas 24(0)-24(N) and 24'(0)-24'(N) increase as the distances from the row decoder 21 to the sense amplifier areas 24(0)-24(N) and 24'(0)-24'(N) increase. As a result, when the common power supply voltages are first provided to the power supply nodes XP and XN, the voltages provided to the farther sense amplifiers (e.g., the sense amplifiers in the sense amplifier areas 24(0) and 24'(0) for the mat 23(0)) may be delayed relative to when the voltages are provided to the closer sense amplifiers (e.g., the sense amplifiers in the sense amplifier areas 24(N) and 24'(N) for the mat 23(N)).

Figure 3:
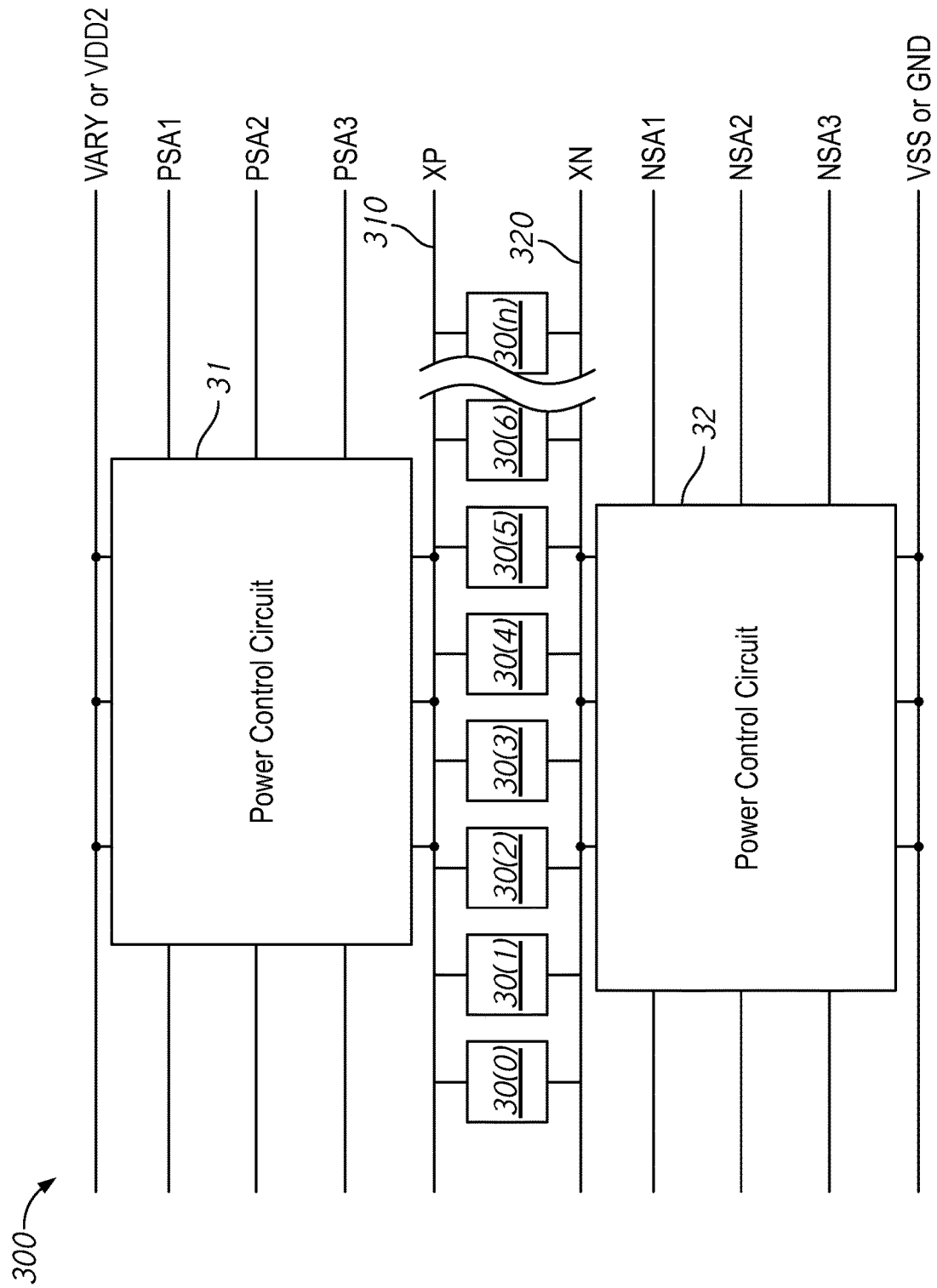
FIG. 3 is a schematic diagram of a sense amplifier area including sense amplifiers and power control circuits coupled to the sense amplifiers according to an embodiment of the disclosure.

FIG. 3 is a schematic diagram of a sense amplifier area 300 including sense amplifiers and power control circuits 31 and 32 coupled to the sense amplifiers 30(0)-30(n) according to an embodiment of the disclosure. In some embodiments, the sense amplifier area 300 may be one of the sense amplifier areas 24(0)-24(N) or 24'(0)-24'(N).

The power control circuit 31 may be coupled to the sense amplifiers 30(0)-30(n) at a common power supply node XP 310. The power control circuit 32 may be coupled to the sense amplifiers 30(0)-30(n) at a common power supply node XN 320.

The power control circuit 31 may receive a positive power supply voltage, such as an array voltage VARY or a positive power supply voltage VDD2. The power control circuit 31 may also receive control signals, including control signals PSA1, PSA2 and PSA3. Depending on states of the control signals, such as the control signals PSA1-PSA3, the power control circuit 31 may adjust a drive strength (e.g., capacitance per time unit) in providing the positive power supply voltage to the common power supply node XP 310. In some embodiments, the control signals PSA1-PSA3 may be activated in an ascending order. For example, the control signal PSA1 may be activated first, the control signal PSA2 may be activated next, and the control signal PSA3 may be activated after the activation of the control signal PSA2.

The power control circuits 31 of the sense amplifier areas 300 (e.g., the sense amplifier areas 24(0)-24(N) and 24'(0)-24'(N) in FIG. 2) may provide the positive power supply voltage with different drive strengths to sense amplifiers 30(0)-30(n) in the sense amplifier area 300 when the sense amplifiers 30(0)-30(n) are first enabled (e.g., responsive to the control signal PSA1). In some embodiments, the drive strength of the power control circuits 31 for sense amplifiers 30(0)-30(n) in the sense amplifier area 300 (e.g., sense amplifier areas 24(0), 24(1), 24'(0), 24'(1), etc.) disposed farther from a row decoder (e.g., the row decoder 21) may be configured to be greater than the drive strength of the power control circuits 31 for sense amplifiers 30(0)-30(n) in the sense amplifier area 300 (e.g., sense amplifier areas 24(N), 24'(N), etc.) disposed closer to the row decoder when the sense amplifiers 30(0)-30(n) are first enabled(e.g., responsive to the control signal PSA1). In some embodiments, the drive strength may be increased to be constant for sense amplifiers 30(0)-30(n) in all the sense amplifier areas 300 responsive to the control signals PSA2 and PSA3 after a while the drive strengths were initially configured to be different for different sense amplifier areas 300 responsive to the control signal PSA1 according to the distance from the row decoder.

The power control circuit 32 may receive a negative power supply voltage VSS or a ground voltage GND. The power control circuit 32 may also receive control signals, including control signals NSA1, NSA2 and NSA3. Depending on states of the control signals, such as the control signals NSA1-NSA3, the power control circuit 32 may adjust a drive strength in providing the negative power supply voltage VSS or the ground voltage GND to the a common power supply node XN 320. In some embodiments, the control signals NSA1-NSA3 may be activated in an ascending order. For example, the control signal NSA1 may be activated first, the control signal NSA2 may be activated next, and the control signal NSA3 may be activated after the activation of the control signal NSA2.

The power control circuits 32 of the sense amplifier areas 300 (e.g., the sense amplifier areas 24(0)-24(N) and 24'(0)-24'(N) in FIG. 2) may provide the negative power supply voltage VSS or the ground voltage GND with different drive strengths to sense amplifiers 30(0)-30(n) in the sense amplifier areas 300 when the sense amplifiers 30(0)-30(n) are first enabled (e.g., responsive to the control signal NSA1). In some embodiments, the drive strength of the power control circuits 32 for sense amplifiers 30(0)-30(n) in the sense amplifier area 300 (e.g., sense amplifier areas 24(0), 24(1), 24'(0), 24'(1), etc.) disposed farther from a row decoder (e.g., the row decoder 21) may be configured to be greater than the drive strength of the power control circuits 32 for sense amplifiers 30(0)-30(n) in the sense amplifier area 300 (e.g., sense amplifier areas 24(N), 24'(N), etc.) disposed closer to the row decoder when the sense amplifiers 30(0)-30(n) are first enabled (e.g., responsive to the control signal NSA1). In some embodiments, the drive strength may be increased to be constant for sense amplifiers 30(0)-30(n) in all the sense amplifier areas 300 responsive to the control signals NSA2 and NSA3 after a while the drive strengths were initially configured to be different for different sense amplifier areas 300 responsive to the control signal NSA1 according to the distance from the row decoder.

Figure 4:
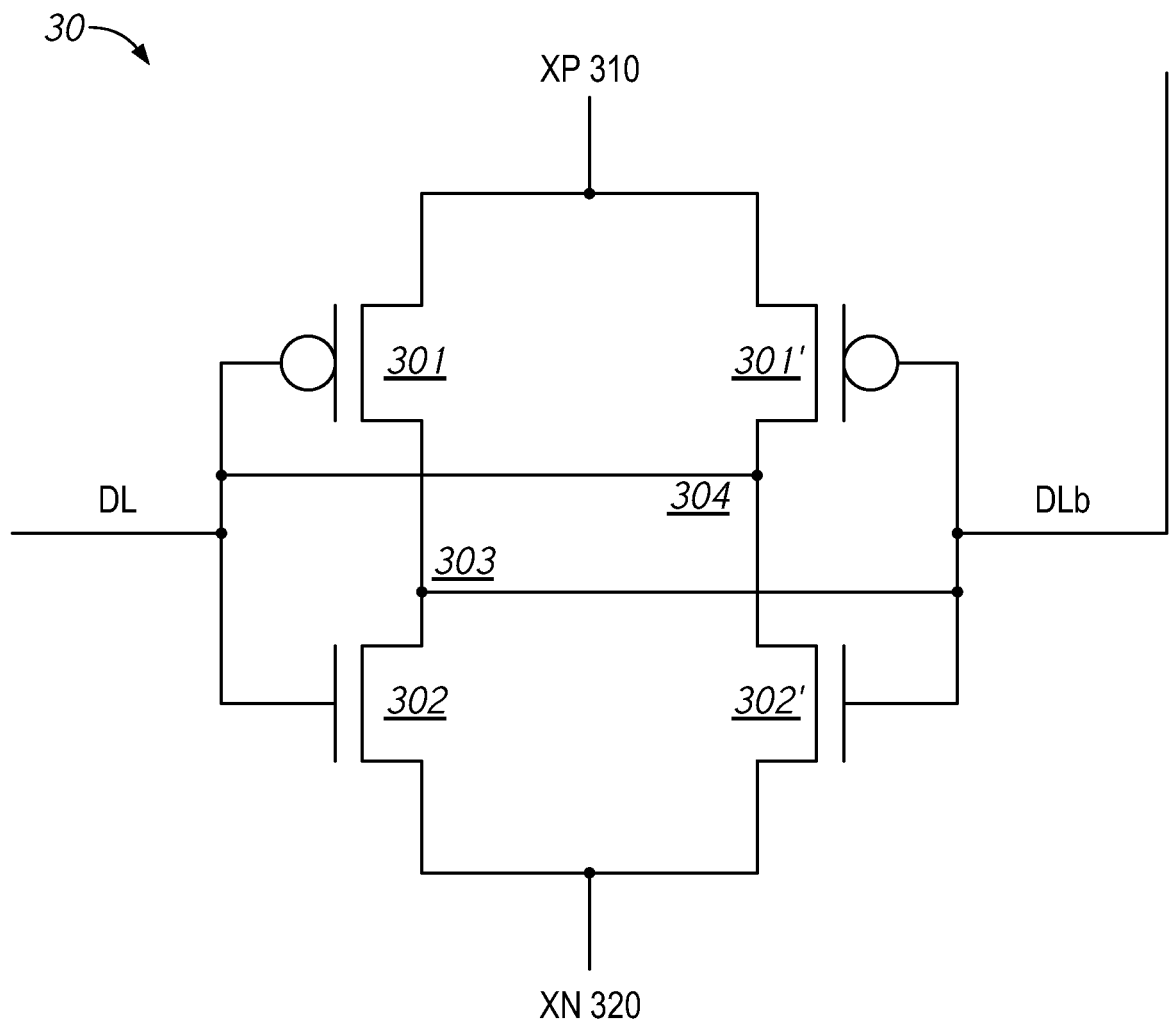
FIG. 4 is a schematic diagram of a sense amplifier and a pair of complementary digit lines according to an embodiment of the disclosure.

FIG. 4 is a schematic diagram of a sense amplifier 30 and a pair of complementary digit lines DL and DLb according to an embodiment of the disclosure. The digit lines DL and DLb may represent the digit lines DL and DLb in FIG. 1 in some embodiments of the disclosure. The sense amplifier 30 may drive the digit line DL to a high or low voltage level corresponding to a sensed data state. The sense amplifier 30 may also drive the digit line DLb to the complementary voltage level (e.g., the high voltage level is complementary to the low voltage level and the low voltage level is complementary to the high voltage level) during the sense operation.

The sense amplifier 30 includes first type of transistors (e.g., p-type field effect transistors (PFET)) 301 and 301' having drains coupled to nodes 303 and 304, respectively. The sense amplifier 30 further includes second type of transistors (e.g., n-type field effect transistors (NFET)) 302 and 302' having drains coupled to the nodes 303 and 304, respectively. The digit line DL is coupled to the node 304 and the digit line DLb is coupled to the node 303. Gates of the transistors 301 and 302 are coupled to the digit line DL and the node 304. Gates of the transistors 301' and 302' are coupled to the digit line DLb and the node 303. Sources of the transistors 301 and 301' are coupled to the common power supply node XP 310. Sources of the transistors 302 and 302' are coupled to the common power supply node XN 320. The common power supply node XP 310 may receive the positive power supply voltage from the power control circuit 31. The other common power supply node XN 320 may receive the ground voltage GND or the negative power supply voltage VSS from the power control circuit 32.

Figure 5:
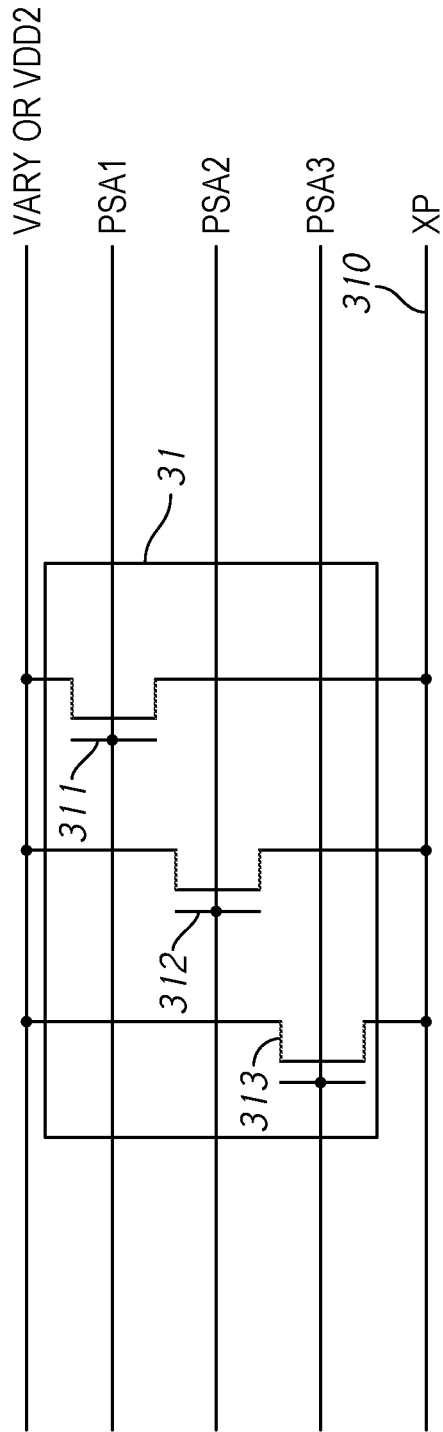
FIG. 5 is a schematic diagram of the power control circuit according to an embodiment of the disclosure.

FIG. 5 is a schematic diagram of the power control circuit 31 according to an embodiment of the disclosure. In some embodiments shown in FIG. 5, the power control circuit 31 includes transistors 311, 312 and 313 that are coupled to the common power supply node XP 310. In some embodiments, as shown in FIG. 5, the transistors 311, 312 and 313 may be n-channel field effect transistors, however, the transistors 313, 312 and 313 may be any combination of transistors to achieve the similar effect combined with a combination of control signals PSA1, PSA2 and PSA3. The transistors 311, 312 and 313 may provide a positive power supply voltage, such as the array voltage VARY or the positive power supply voltage VDD2 to the common power supply node XP 310. The positive power supply voltage is provided to the common power supply node XP 310 with the combined drive strength of the transistors 311, 312 and 313. Although the power control circuit 31 of FIG. 5 is described as including three transistors 311, 312 and 313, some embodiments may include a greater or fewer number of transistors consisting the power control circuit 31 that are coupled to the common power supply node XP 310 than shown in the particular example of FIG. 5.

The transistors 311, 312 and 313 are coupled to each other in parallel. The transistors 311, 312 and 313 may have drains that receive the positive power supply voltage, such as the array voltage VARY or the positive power supply voltage VDD2. The transistors 311, 312 and 313 may have gates that receive the control signals PSA1, PSA2 and PSA3, respectively. Sources of the transistors 311, 312 and 313 are coupled to the common power supply node XP 310 that is configured to receive the positive power supply voltage through a number of transistors. While each of the transistors 311, 312, and 313 have respective drive strengths, the positive power supply voltage is provided to the common power supply node XP 310 based on the combined drive strength of the activated ones of the transistors 311, 312, and 313. Depending on states of the control signals PSA1-PSA3, the transistors 311, 312 and 313 may be activated, and as a result, the power control circuit 31 may adjust the combined drive strength in providing the positive power supply voltage to the common power supply node XP 310.

In some embodiments, the control signals PSA1-PSA3 may be activated in an ascending order. For example, the control signal PSA1 may be activated first, the control signal PSA2 may be activated next, and the control signal PSA3 may be activated after the activation of the control signal PSA2. The power control circuits 31 of the sense amplifier areas 300 (e.g., the sense amplifier areas 24(0)-24(N) and 24'(0)-24'(N) in FIG. 2) including different drive strength ratios of the transistors 311, 312 and 313 in a combined drive strength of the transistors 311, 312 and 313 may provide different drive strengths to sense amplifiers 30(0)-30(n) in the sense amplifier areas 300, responsive to the control signal PSA1.

In some embodiments, the drive strength of the transistor 311 in the power control circuit 31 in the sense amplifier area 300 (e.g., sense amplifier areas 24(0), 24(1), 24'(0), 24'(1), etc.) disposed farther from a row decoder (e.g., the row decoder 21) may be configured to be greater than the transistor 311 in the power control circuit 31 in the sense amplifier area 300 (e.g., sense amplifier areas 24(N), 24'(N), etc.) disposed closer to the row decoder. In some embodiments, drive strength of the transistor 313 in the power control circuit 31 in the sense amplifier area 300 (e.g., sense amplifier areas 24(0), 24(1), 24'(0), 24'(1), etc.) disposed farther from a row decoder (e.g., the row decoder 21) may be configured to be less than the drive strength of the transistor 313 in the power control circuit 31 in the sense amplifier area 300 (e.g., sense amplifier areas 24(N), 24'(N), etc.) disposed closer to the row decoder. In some embodiments, the total drive strength provided by the activated transistors 311-313 may be configured to be constant in the power control circuits 31 in the sense amplifier areas 300 responsive to the active states of the control signals PSA1-PSA3.

Figure 6:
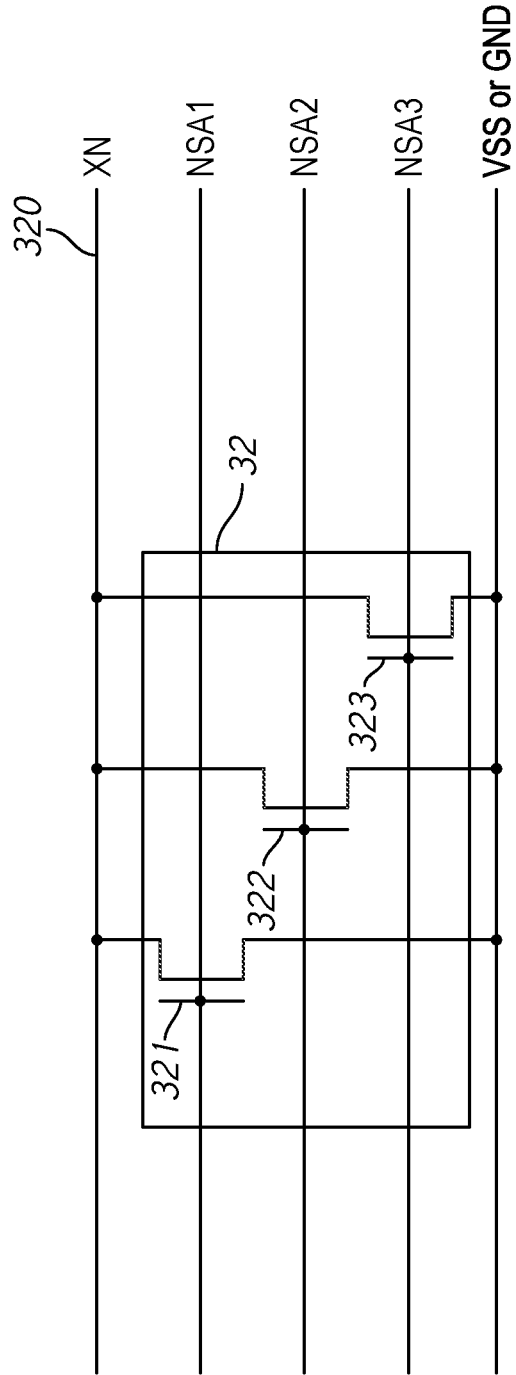
FIG. 6 is a schematic diagram of the power control circuit according to an embodiment of the disclosure.

FIG. 6 is a schematic diagram of the power control circuit 32 according to an embodiment of the disclosure. In some embodiments shown in FIG. 6, the power control circuit 32 includes transistors 321, 322 and 323 that are coupled to the common power supply node XN 320. In some embodiments, as shown in FIG. 6, the transistors 321, 322 and 323 may be n-channel field effect transistors, however, the transistors 321, 322 and 323 may be any combination of transistors to achieve the similar effect combined with a combination of control signals NSA1, NSA2 and NSA3. The transistors 321, 322 and 323 may provide a negative power supply voltage VSS or a ground voltage GND to the common power supply node XN 320. The negative power supply voltage VSS or the ground voltage GND with the combined drive strength of the transistors 321, 322 and 323. Although the power control circuit 32 of FIG. 6 is described as including three transistors 321, 322 and 323, some embodiments may include a greater or fewer number of transistors consisting the power control circuit 32 that are coupled to the common power supply node XP 310 than shown in the particular example of FIG. 6.

The transistors 321, 322 and 323 are coupled to each other in parallel. The transistors 321, 322 and 323 may have sources that receive the negative power supply voltage VSS or the ground voltage GND. The transistors 321, 322 and 323 may have gates that receive control signals NSA1, NSA2 and NSA3, respectively. Drains of the transistors 321, 322 and 323 are coupled to the common power supply node XN 320 that is configured to receive the negative power supply voltage VSS or the ground voltage GND through a number of transistors. While each of the transistors 321, 322, and 323 have respective drive strengths, the negative power supply voltage VSS or the ground voltage GND is provided to the common power supply node XP 320 based on the combined drive strength of the activated ones of the transistors 321, 322, and 323. Depending on states of the control signals NSA1-NSA3, the transistors 321, 322 and 323 may be activated, and as a result, the power control circuit 32 may adjust the drive strength in providing the negative power supply voltage or the ground voltage to the common power supply node XN 320.

In some embodiments, the control signals NSA1-NSA3 may be activated in an ascending order. For example, the control signal NSA1 may be activated first, the control signal NSA2 may be activated next, and the control signal NSA3 may be activated after the activation of the control signal NSA2. The power control circuits 32 of the sense amplifier areas 300 (e.g., the sense amplifier areas 24(0)-24(N) and 24'(0)-24'(N) in FIG. 2) including different drive strength ratios of the transistors 321, 322 and 323 in a combined drive strength of the transistors 321, 322 and 323 may provide different drive strengths to sense amplifiers 30(0)-30(n) in the sense amplifier areas 300, responsive to the control signal NSA1.

In some embodiments, drive strength of the transistor 321 in the power control circuit 32 in the sense amplifier area 300 (e.g., sense amplifier areas 24(0), 24(1), 24'(0), 24'(1), etc.) disposed farther from the row decoder (e.g., the row decoder 21) may be configured to be greater than the drive strength of the transistor 321 in the power control circuit 32 in the sense amplifier area 300 (e.g., sense amplifier areas 24(N) and 24'(N), etc.) disposed closer to the row decoder. In some embodiments, the drive strength of the transistor 323 in the power control circuit 32 in the sense amplifier area 300 (e.g., sense amplifier areas 24(0), 24(1), 24'(0), 24'(1), etc.) disposed farther from a row decoder (e.g., the row decoder 21) may be configured to be less than the drive strength of the transistor 323 in the power control circuit 32 in the sense amplifier area 300 (e.g., sense amplifier areas 24(N) and 24'(N), etc.) disposed closer to the row decoder. In some embodiments, the total drive strength provided by the activated transistors 321-323 may be configured to be constant in the power control circuits 32 in the sense amplifier areas 300 responsive to the active states of the control signals NSA1-NSA3.

As described earlier, when the common power supply voltages are first provided to the power supply nodes XP 310 and XN 320, the transistors 311 and 321 in the sense amplifier area 300 (e.g., sense amplifier areas 24(0), 24(1), 24'(0), 24'(1), etc.) disposed farther from the row decoder may provide greater drive strengths than the transistors 311 and 321 in the sense amplifier area 300 (e.g., sense amplifier areas 24(0), 24(1), 24'(0), 24'(1), etc.) disposed closer to the row decoder. These different drive strengths may compensate the uneven distribution of the common power supply voltages from the row decoder to the common power supply nodes XP 310 and XN 320. Later, the power control circuits 31 and 32 may increase the drive strength to the constant level in the sense amplifier areas 300, while the common power supply voltages from the row decoder on the common power supply nodes XP 310 and XN 320 may become stable among the sense amplifier areas 300.

FIG. 7 is a table of a combination of drive strength ratios of transistors 311-313 and 321-323 in the power control circuits 31 and 32 and activation timings of control signals PSA1-PSA3 and NSA1-NSA3 to the transistors 311-313 and 321-323 in the power control circuits 31 and 32 according to an embodiment of the disclosure.

For example, for the power control circuit 31, drive strength ratios of 50%, 25% and 25% may be assigned to the transistors 311, 312 and 313 in a semiconductor area 24(0) for the farthest mat (e.g., the mat 23(0)) respectively. The combined drive strength may be 50% when the control signal PSA1 is activated (e.g., set to a logic high level (ON)) while the other control signals are set to a logic low level (OFF) at time 0 and the transistor 311 becomes conductive. The combined drive strength may be (50+25=)75% when the control signal PSA2 is also activated at time 200 (ps) in addition to the control signal PSA1 and the transistor 312 also becomes conductive in addition to the transistor 311. The combined drive strength may be (50+25+25=)100% when the control signal PSA3 is also activated at time 400 (ps) in addition to the control signals PSA1 and PSA2 and the transistor 313 also becomes conductive in addition to the transistors 311 and 312.

In contrast, drive strength ratios of 30%, 35% and 35% may be assigned to the transistors 311, 312 and 313 in a semiconductor area 24(N) for a closest mat (e.g., the mat 23(N)), respectively. The combined drive strength may be 30% when the control signal PSA1 is activated (e.g., set to a logic high level (ON)) while the other control signals are set to a logic low level (OFF) at time 0 and the transistor 311 becomes conductive. The combined drive strength may be (30+35=)65% when the control signal PSA2 is also activated at time 200 (ps) in addition to the control signal PSA1 and the transistor 312 also becomes conductive in addition to the transistor 311. The combined drive strength may be (30+35+35=)100% when the control signal PSA3 is also activated at time 400 (ps) in addition to the control signals PSA1 and PSA2 and the transistor 313 also becomes conductive in addition to the transistors 311 and 312.

For example, turning to the power control circuit 32, drive strength ratios of 50%, 25% and 25% may be assigned to the transistors 321, 322 and 323 in the semiconductor area 24(0) for the farthest mat (e.g. mat 23(0)), respectively. The combined drive strength may be 50% when the control signal NSA1 is activated (e.g., set to a logic high level (ON)) while the other control signals are set to a logic low level (OFF) at time 0 and the transistor 321 becomes conductive. The combined drive strength may be (50+25=)75% when the control signal NSA2 is also activated at time 200 (ps) in addition to the control signal NSA1 and the transistor 322 also becomes conductive in addition to the transistor 321. The combined drive strength may be (50+25+25=)100% when the control signal NSA3 is also activated at time 400 (ps) in addition to the control signals NSA1 and NSA2 and the transistor 323 also becomes conductive in addition to the transistors 321 and 322.

In contrast, drive strength ratios of 30%, 35% and 35% may be assigned to the transistors 321, 322 and 323 in the semiconductor area 24(N) for the closest mat (e.g., the mat 23(N)), respectively. The combined drive strength may be 30% when the control signal NSA1 is activated (e.g., set to a logic high level (ON)) while the other control signals are set to a logic low level (OFF) at time 0 and the transistor 321 becomes conductive. The combined drive strength may be (30+35=)65% when the control signal NSA2 is also activated at time 200 (ps) in addition to the control signal NSA1 and the transistor 322 also becomes conductive in addition to the transistor 321. The combined drive strength may be (30+35+35=)100% when the control signal NSA3 is also activated at time 400 (ps) in addition to the control signals NSA1 and NSA2 and the transistor 323 also becomes conductive in addition to the transistors 321 and 322.

In this manner, different drive strengths of transistors in power control circuits may provide different drive strengths of power control circuits across sense amplifier areas corresponding to mats according to distances from a row decoder. Thus, the power control circuits of different drive strengths may adjust or compensate for differences in drive strengths of the common power supply circuits on the common power supply nodes. The example of FIG. 7 describes two different drive strengths of transistors for the farthest and closest power control circuits 31 and two different drive strengths of transistors for farthest and closest power control circuits 32. However, the disclosure is not limited to embodiments having only two different drive strengths of transistors for the power control circuits 31 and/or 32. For example, in some embodiments of the disclosure, there may be other power control circuits 31 and/or 32 between the farthest and closest power control circuits that have transistors with drive strengths that are different from the two drive strengths previously described (e.g., a third, fourth, fifth, etc. combination of drive strengths of transistors).

Figure 8:
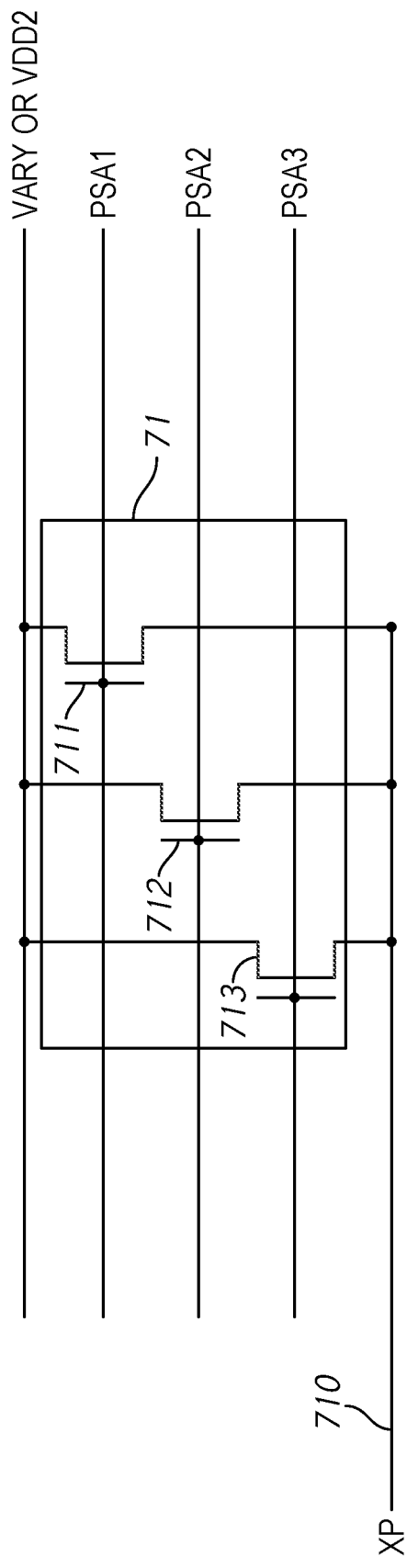
FIG. 8 is a schematic diagram of a common power supply circuit according to an embodiment of the disclosure.

FIG. 8 is a schematic diagram of a common power supply circuit 71 according to an embodiment of the disclosure. In some embodiments, the common power supply circuit 71 may be at least one of the common power supply circuit 22a or the common power supply circuit 22a' in the row decoder 21 of FIG. 2. In some embodiments shown in FIG. 8, the common power supply circuit 71 includes transistors 711, 712 and 713 that are coupled to the common power supply node XP 710. In some embodiments, as shown in FIG. 8, the transistors 711, 712 and 713 may be n-channel field effect transistors, however, the transistors 711, 712 and 713 may be any combination of transistors to achieve the similar effect combined with a combination of control signals PSA1, PSA2 and PSA3. The transistors 711, 712 and 713 may provide a positive power supply voltage, such as the array voltage VARY or the positive power supply voltage VDD2 to the common power supply node XP 710. The positive power supply voltage is provided to the common power supply node XP 710 with the combined drive strength of the transistors 711, 712 and 713. Although the common power supply circuit 71 of FIG. 8 is described as including three transistors 711, 712 and 713, some embodiments may include a greater or fewer number of transistors consisting the common power supply circuit 71 that are coupled to the common power supply node XP 710 than shown in the particular example of FIG. 8.

The transistors 711, 712 and 713 are coupled to each other in parallel. The transistors 711, 712 and 713 may have drains that receive the positive power supply voltage, such as the array voltage VARY or the positive power supply voltage VDD2. The transistors 711, 712 and 713 may have gates that receive the control signals PSA1, PSA2 and PSA3, respectively. Sources of the transistors 711, 712 and 713 are coupled to the common power supply node XP 710 that is configured to receive the positive power supply voltage through a number of transistors, (e.g., any combination of the transistors 711, 712 and 713) that provides a combined drive strength. Depending on states of the control signals PSA1-PSA3, the transistors 711, 712 and 713 may be activated, and as a result, the common power supply circuit 71 may adjust the combined drive strength in providing the positive power supply voltage to the common power supply node XP 710.

In some embodiments, the control signals PSA1-PSA3 may be activated in an ascending order. For example, the control signal PSA1 may be activated first, the control signal PSA2 may be activated next, and the control signal PSA3 may be activated after the activation of the control signal PSA2. The drive strengths of the transistors 711, 712 and 713 may be different to adjust the combined drive strength according to activations of the control signals PSA1, PSA2 and PSA3. In some embodiments, the drive strength of the transistor 711 may be configured to be greater and the drive strength of the transistor 713 may be configured to be less. In some embodiments, the drive strength of the transistor 711 may be configured to be less and the drive strength of the transistor 713 may be configured to be greater. In some embodiments, the total drive strength provided by the activated transistors 711-713 may be configured to be constant responsive to the active states of the control signals PSA1-PSA3.

Figure 9:
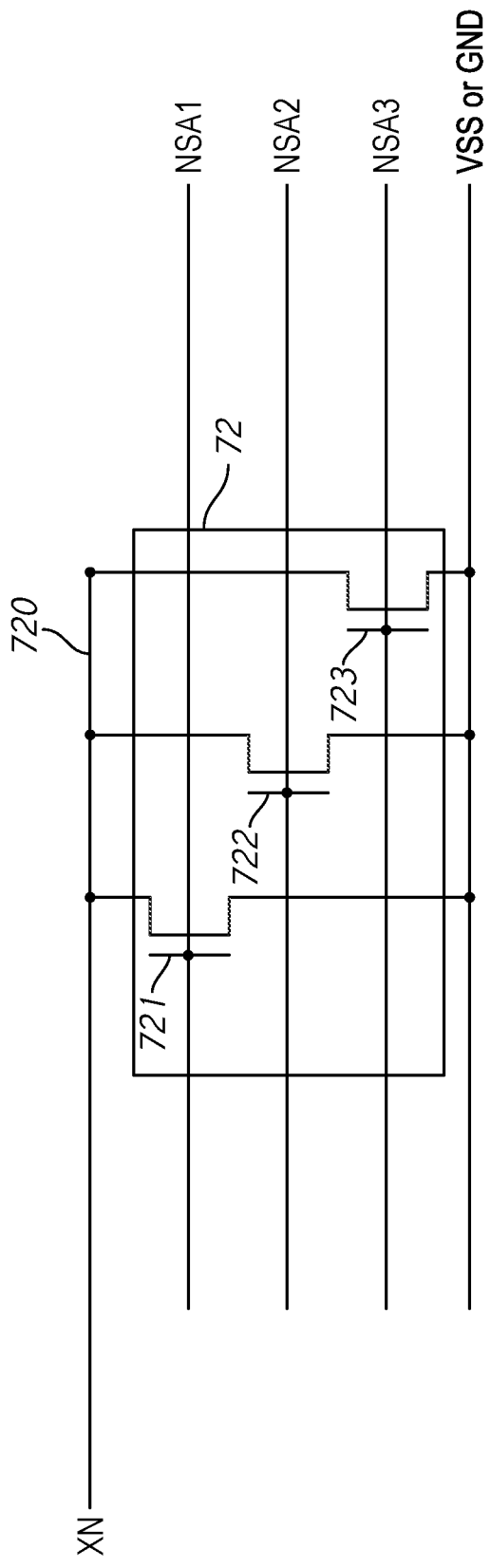
FIG. 9 is a schematic diagram of a common power supply circuit according to an embodiment of the disclosure.

FIG. 9 is a schematic diagram of a common power supply circuit 72 according to an embodiment of the disclosure. In some embodiments, the common power supply circuit 72 may be at least one of the common power supply circuit 22b or the common power supply circuit 22b' in the row decoder 21 of FIG. 2. In some embodiments shown in FIG. 9, the common power supply circuit 72 includes transistors 721, 722 and 723 that are coupled to the common power supply node XN 720. In some embodiments, as shown in FIG. 9, the transistors 721, 722 and 723 may be n-channel field effect transistors, however, the transistors 721, 722 and 723 may be any combination of transistors to achieve the similar effect combined with a combination of control signals NSA1, NSA2 and NSA3. The transistors 721, 722 and 723 may provide the ground voltage GND or the negative power supply voltage VSS to the common power supply node XN 720. The ground voltage GND or the negative power supply voltage VSS is provided to the common power supply node XN 720 with the combined drive strength of the transistors 721, 722 and 723. Although the common power supply circuit 72 of FIG. 9 is described as including three transistors 721, 722 and 723, some embodiments may include a greater or fewer number of transistors consisting the common power supply circuit 72 that are coupled to the common power supply node XP 720 than shown in the particular example of FIG. 9.

The transistors 721, 722 and 723 are coupled to each other in parallel. The transistors 721, 722 and 723 may have drains that receive the ground voltage GND or the negative power supply voltage VSS. The transistors 721, 722 and 723 may have gates that receive the control signals NSA1, NSA2 and NSA3, respectively. Sources of the transistors 721, 722 and 723 are coupled to the common power supply node XN 720 that is configured to receive the positive power supply voltage through a number of transistors, (e.g., any combination of the transistors 721, 722 and 723) that provides a combined drive strength. Depending on states of the control signals NSA1-NSA3, the transistors 721, 722 and 723 may be activated, and as a result, the common power supply circuit 72 may adjust the combined drive strength in providing the positive power supply voltage to the common power supply node XN 720.

In some embodiments, the control signals NSA1-NSA3 may be activated in an ascending order. For example, the control signal NSA1 may be activated first, the control signal NSA2 may be activated next, and the control signal NSA3 may be activated after the activation of the control signal NSA2. The drive strengths of the transistors 721, 722 and 723 may be different to adjust the combined drive strength according to activations of the control signals NSA1, NSA2 and NSA3. In some embodiments, the drive strength of the transistor 721 may be configured to be greater and the drive strength of the transistor 723 may be configured to be less. In some embodiments, the drive strength of the transistor 721 may be configured to be less and the drive strength of the transistor 723 may be configured to be greater. In some embodiments, the total drive strength provided by the activated transistors 721-723 may be configured to be constant responsive to the active states of the control signals NSA1-NSA3.

By combining the drive strengths of the common power supply circuits, such as the common power supply circuits 71 and 72 together with the drive strengths of power control circuits in sense amplifier areas, such as the power control circuits 31 and 32 adjusted accordingly to their distances from a row decoder, such as the row decoder 21, differences among power supply voltages provided to common power supply nodes of sense amplifiers across mats may be reduced.

FIG. 10 is a table of combinations of drive strength ratios of transistors 711-713 and 721-723 in the common power supply circuits 71 and 72 and activation timings of control signals PSA1-PSA3 and NSA1-NSA3 to the transistors 711-713 and 721-723 in the common power supply circuits 71 and 72 according to an embodiment of the disclosure.

"Common Source Variation 1" is a combination of the drive strength ratios of the transistors 711-713 and 721-723 and activation timings of control signals PSA1-PSA3 and NSA1-NSA3. The drive strength ratios assigned to the transistors 711-713 of the common power supply circuit 71 and the drive strength ratios assigned to the transistors 721-723 of the common power supply circuit 72 may be the same, respectively. The activation timings of the control signals PSA1-PSA3 and the activation timings of the control signals NSA1-NSA3 may be the same, respectively.

Drive strengths of 30%, 35% and 35% in the common power supply circuit 71 may be assigned to the transistors 711, 712 and 713, respectively. The combined drive strength may be 30% when the control signal PSA1 is activated (e.g., set to a logic high level (ON)) while the other control signals are set to a logic low level (OFF) at time 0 and the transistor 711 becomes conductive. The combined drive strength may be (30+35=)65% when the control signal PSA2 is also activated at time 200 (ps) later than the control signal PSA1 and the transistor 712 also becomes conductive in addition to the transistor 711. The combined drive strength may be (30+35+35=)100% when the control signal PSA3 is also activated at time 400 (ps) later than the control signal PSA2 and the transistor 713 also becomes conductive in addition to the transistors 711 and 712. Drive strength ratios of 30%, 35% and 35% may be assigned to the transistors 721, 722 and 723, respectively. The combined drive strength may be 30% when the control signal NSA1 is activated (e.g., set to a logic high level (ON)) while the other control signals are set to a logic low level (OFF) at time 0 and the transistor 721 becomes conductive. The combined drive strength may be (30+35=)65% when the control signal NSA2 is also activated at time 200 (ps) later than the control signal NSA1 and the transistor 722 also becomes conductive in addition to the transistor 721. The combined drive strength may be (30+35+35=)100% when the control signal NSA3 is also activated at time 400 (ps) later than the control signal NSA2 and the transistor 723 also becomes conductive in addition to the transistors 721 and 722.

"Common Source Variation 2" is another combination of drive strength ratios and activation timings of control signals PSA1-PSA3 and NSA1-NSA3. The drive strength ratios assigned to the transistors 711-713 of the common power supply circuit 71 and the drive strength ratios assigned to the transistors 721-723 of the common power supply circuit 72 may be different. The activation timings of the control signals PSA1-PSA3 and the activation timings of the control signals NSA1-NSA3 may be different.

For example, drive strengths of 20%, 40% and 40% in the common power supply circuit 71 may be assigned to the transistors 711, 712 and 713, respectively. The combined drive strength may be 20% when the control signal PSA1 is activated (e.g., set to a logic high level (ON)) while the other control signals are set to a logic low level (OFF) at time 100 (ps) and the transistor 711 becomes conductive. The combined drive strength may be (20+40=)60% when the control signal PSA2 is also activated at time 200 (ps) that is later than the control signal PSA1 and the transistor 712 also becomes conductive in addition to the transistor 711. The combined drive strength may be (20+40+40=)100% when the control signal PSA3 is also activated at time 500 (ps) that is later than the control signal PSA2 and the transistor 713 also becomes conductive in addition to the transistors 711 and 712. Drive strength ratios of 70%, 15% and 15% may be assigned to the transistors 721, 722 and 723, respectively. The combined drive strength may be 70% when the control signal NSA1 is activated (e.g., set to a logic high level (ON)) while the other control signals are set to a logic low level (OFF) at time 0 and the transistor 721 becomes conductive. The combined drive strength may be (70+15=)85% when the control signal NSA2 is also activated at time 300 (ps) in addition to the control signal NSA1 and the transistor 722 also becomes conductive in addition to the transistor 721. The combined drive strength may be (70+15+15=)100% when the control signal NSA3 is also activated at time 600 (ps) in addition to the control signals NSA1 and NSA2 and the transistor 723 also becomes conductive in addition to the transistors 721 and 722.

Different drive strengths of transistors in power control circuits may provide adjustment of drive strengths of power control circuits across sense amplifier areas corresponding to mats according to distances from a row decoder. Thus, the power control circuits of different drive strengths may adjust or compensate differences in drive strengths of the common power supply circuits on the common power supply nodes.

Variations of voltage supply control according to a distance of each mat in a same bank from a row decoder have been described. Sense amplifiers for each mat include a combination of power supply transistors coupled between a power supply voltage source and a common power supply node of the sense amplifiers. One of power supply transistors coupled to a common power supply node provided for a farther mat that turns on response to a control signal that is activated earlier has a drive strength that is greater than a drive strength of one of power supply transistors coupled to a common power supply node provided for a closer mat that turns on response to the control signal. One of power supply transistors coupled to the common power supply node for the farther mat that turns on response to another control signal that is activated later has a drive strength that is less than a drive strength of one of power supply transistors coupled to the common power supply node for the closer mat that turns on response to the other control signal. Consequently, the power supply transistors for the farther mat may provide a greater drive strength to the common power supply node and the power supply transistors for the closer mat may provide a less drive strength to the common power supply node in the beginning of power supply. Later, the same drive strength is provided by the power supply transistors while the power supply voltage from the row decoder may be stabilized to be constant regardless of the distance. Thus, throughout the voltage compensation, the sense amplifiers of farther mat and the closer mat may receive a constant power supply voltage.

Although various embodiments have been disclosed, it will be understood by those skilled in the art that the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

What is claimed is:

1. An apparatus comprising:
    a bank including:
        a first plurality of memory cells;
        a second plurality of memory cells;
        first sense amplifiers coupled to the first plurality of memory cells;
        second sense amplifiers coupled to the second plurality of memory cells;
        a first power control circuit coupled to the first sense amplifiers at a first common power supply node, the first power control circuit configured to receive a plurality of control signals; and
        a second power control circuit coupled to the second sense amplifiers at a second common power supply node, the second power control circuit configured to receive the plurality of control signals,
    wherein the first and second power control circuits are configured to have first and second drive strengths respectively responsive to activation of a control signal of the plurality of control signals,
    wherein the control signal is activated earlier than activation of at least one other control sional of the plurality of control signals, and
    wherein the first drive strength and the second drive strength are different from each other.

2. An apparatus, comprising:
    a bank including:
        a first plurality of memory cells;
        a second plurality of memory cells;
        first sense amplifiers coupled to the first plurality of memory cells;
        second sense amplifiers coupled to the second plurality of memory cells;
        a first power control circuit coupled to the first sense amplifiers at a first common power supply node. the first power control circuit configured to receive a plurality of control signals; and
        a second power control circuit coupled to the second sense amplifiers at a second common power supply node, the second power control circuit configured to receive the plurality of control signals,
    wherein the first and second power control circuits are configured to have first and second drive strengths respectively responsive to activation of a control signal of the plurality of control signals, wherein the first drive strength and the second drive strength are different from each other, and wherein the first power control circuit and the second power control circuit are configured to have a same drive strength responsive to activation of all the plurality of control signals.

3. An apparatus comprising:
a bank including:
    a first plurality of memory cells;
    a second plurality of memory cells;
    first sense amplifiers coupled to the first plurality of memory cells:
    second sense amplifiers coupled to the second plurality of memory cells;
    a first power control circuit coupled to the first sense amplifiers at a first common power supply node, the first power control circuit configured to receive a plurality of control signals; and
    a second power control circuit coupled to the second sense amplifiers at a second common power supply node, the second power control circuit configured to receive the plurality of control signals,
wherein the first and second power control circuits are configured to have first and second drive strengths respectively responsive to activation of a control signal of the plurality of control signals,
wherein the first drive strength and the second drive strength are different from each other, and
wherein the first common power supply node is coupled to the second common power supply node.

4. The apparatus of claim 3, further comprising a row decoder configured to provide a common power supply voltage to the first and second common power supply nodes,
    wherein the first power control circuit is farther than the second power control circuit from the row decoder, and
    wherein the first drive strength is greater than the second drive strength.

5. The apparatus of claim 4, wherein the bank comprises:
a first mat including the first plurality of memory cells; and
a second mat including the second plurality of memory cells;
wherein the first mat is farther than the second mat from the row decoder.

6. An apparatus comprising:
a bank including:
    a first plurality of memory cells;
    a second plurality of memory cells:
    first sense amplifiers coupled to the first plurality of memory cells;
    second sense amplifiers coupled to the second pluralit of memory cells;
    a first power control circuit coupled to the first sense amplifiers at a first common power supply node. the first power control circuit configured to receive a plurality of control signals;
    a second power control circuit coupled to the second sense amplifiers at a second common power supply node, the second power control circuit configured to receive the plurality of control signals,
wherein the first and second power control circuits are configured to have first and second drive strengths respectively responsive to activation of a control signal of the plurality of control signals, and wherein the first drive strength and the second drive strength are different from each other;
    a third power control circuit coupled to the first sense amplifiers at a third common power supply node, the first power control circuit configured to receive another plurality of control signals; and
    a fourth power control circuit coupled to the second sense amplifiers at a fourth common power supply node, the second power control circuit configured to receive the other plurality of control signals,
wherein the third and fourth power control circuits are configured to have third and fourth drive strengths respectively responsive to activation of another control signal of the other plurality of control signals, and
wherein the third drive strength and the fourth drive strength are different from each other.

7. The apparatus of claim 6, wherein activation timings of the control signal and the other control signal are different from each other.

8. An apparatus comprising:
a bank comprising:
    a first plurality of memory cells;
    a second plurality of memory cells;
    first sense amplifiers coupled to the first plurality of memory cells and further coupled to a first common power supply node;
    second sense amplifiers coupled to the second plurality of memory cells and further coupled to a second common power supply node;
    first transistor coupled to the first sense amplifiers at the first common power supply node, the first transistor comprises a first drive strength; and
    a second transistor coupled to the second sense amplifiers at the second common power supply node, the second transistor comprises a second drive strength,
wherein the first and second transistors are configured to receive a control signal,
wherein the first and second transistors are configured to be activated responsive to the control signal in an active state, and
wherein the first drive strength and the second drive strength are different from each other.

9. The apparatus of claim 8, further comprising a row decoder configured to provide a common power supply voltage to the first and second common power supply nodes,
    wherein the first sense amplifiers are farther than the second sense amplifiers from the row decoder, and
    wherein the first drive strength is greater than the second drive strength.

10. The apparatus of claim 9, wherein the bank further comprises:
    a third transistor coupled to the first sense amplifiers at the first common power supply node, the third transistor comprises a third drive strength; and
    a fourth transistor coupled to the second sense amplifiers at the second common power supply node, the fourth transistor comprises a fourth drive strength,
wherein the control signal is a first control signal,
wherein the third and fourth transistors are configured to receive a second control signal that is activated later than activation of the first control signal,
wherein the third and fourth transistors are configured to be activated responsive to the active second control signal, and
wherein the third drive strength is less than the fourth drive strength.

11. The apparatus of claim 10, wherein the bank further comprises:
a first plurality of transistors including the first and third transistors, the first plurality of transistors coupled to the first sense amplifiers at the first common power supply node; and
a second plurality of transistors including the second and fourth transistors, the second plurality of transistors coupled to the second sense amplifiers at the second common power supply node, and
wherein a drive strength of the first plurality of transistors being activated and a drive strength of the second plurality of transistors being activated are the same.

12. The apparatus of claim 11, wherein the bank further comprises:
a third plurality of transistors coupled to the first sense amplifiers at a third common power supply node; and
a fourth plurality of transistors coupled to the second sense amplifiers at a fourth common power supply node.

13. The apparatus of claim 10, wherein the bank further comprises:
a fifth transistor coupled to the first sense amplifiers at a third common power supply node, the fifth transistor comprises a fifth drive strength; and
a sixth transistor coupled to the second sense amplifiers at a fourth common power supply node, the sixth transistor comprises a sixth drive strength,
wherein the fifth and sixth transistors are configured to receive a third control signal and further configured to be activated responsive to the third control signal in an active state, and
wherein the third drive strength is different from the fourth drive strength.

14. The apparatus of claim 13, wherein the row decoder is further configured to provide another common power supply voltage to the third and fourth common power supply nodes, and
wherein the third drive strength is greater than the fourth drive strength.

15. The apparatus of claim 13, wherein activation timings of the first and third control signals are different from each other.

16. An apparatus comprising:
a row decoder including:
a common power supply circuit configured to provide a common power supply voltage to a common power supply node responsive to a plurality of control signals; and
a bank including:
a first plurality of memory cells;
a second plurality of memory cells;
first sense amplifiers coupled to the first plurality of memory cells and further coupled to the common power supply node;
second sense amplifiers coupled to the second plurality of memory cells and further coupled to the common power supply node;
a first power control circuit coupled to the first sense amplifiers at the common power supply node ; the first power control circuit configured to receive the plurality of control signals and further configured to provide the common power supply voltage with a first drive strength to the common power supply node responsive to the plurality of control signals; and a second power control circuit coupled to the second sense amplifiers at the common power supply node, the second power control circuit configured to receive the plurality of control signals and further configured to provide the common power supply voltage with a second drive strength to the common power supply node responsive to the plurality of control signals,
wherein the first and second drive strengths are different responsive to activation of a first control signal of the plurality of control signals, and
wherein the common power supply circuit is configured to have a third drive strength and a fourth drive strength different from each other responsive to an activation of the first control signal and an activation of a second control signal after the activation of the first control signal respectively.

17. The apparatus of claim 16, wherein the common power supply circuit comprises:
a first transistor configured to receive the first control signal and further configured to be activated responsive to the activation of the first control signal; and
a second transistor configured to receive the second control signal and further configured to be activated responsive to the activation of the second control signal,
wherein drive strengths of the first transistor and the second transistor are different from each other.

18. The apparatus of claim 16, wherein the common power supply circuit is a first common power supply circuit configured to provide the common power supply voltage that is a first common power supply voltage to the common power supply node that is a first common power supply node responsive to the plurality of control signals that is a first plurality of control signals,
the apparatus further comprises:
a second common power supply circuit configured to provide a second common power supply voltage to a second common power supply node coupled to the first sense amplifiers and the second sense amplifiers responsive to a second plurality of control signals,
a third power control circuit in the bank coupled to the first sense amplifiers at the second common power supply node, the third power control circuit configured to receive the second plurality of control signals and further configured to provide the second common power supply voltage to the second common power supply node responsive to the second plurality of control signals; and
a fourth power control circuit in the bank coupled to the second sense amplifiers at the second common power supply node, the fourth power control circuit configured to receive the second plurality of control signals and further configured to provide the second common power supply voltage to the second common power supply node responsive to the second plurality of control signals,
wherein the third and fourth power control circuits are configured to provide the second common power supply voltages with fifth and sixth drive strengths respectively responsive to activation of a third control signal of the second plurality of control signals, and
wherein the second common power supply circuit is configured to provide the second common power supply voltage with a seventh drive strength and an eighth drive strength different from each other responsive to an activation of the third control signal and an activation of a fourth control signal after the activation of the third control signal respectively.

19. The apparatus of claim 18, wherein activation timings of the first control signal and the third control signal are different from each other.

20. The apparatus of claim 18, wherein a drive strength ratio of the third drive strength in the first common power supply circuit and a drive strength ratio of the seventh drive strength in the second common power supply circuit are different from each other.

* * * * *

UNITED STATES PATENT AND TRADEMARK OFFICE
CERTIFICATE OF CORRECTION

PATENT NO. : 11,901,036 B2  
APPLICATION NO. : 17/692066  
DATED : February 13, 2024  
INVENTOR(S) : Katsuhiro Kitagawa Page 1 of 1

It is certified that error appears in the above-identified patent and that said Letters Patent is hereby corrected as shown below:

In the Claims

| | Reads | Should read |
|---|---|---|
| Column 16, Line 46 | "at least one other control sional" | --at least one other control signal-- |
| Column 17, Line 54 | "coupled to the second pluralit of" | --coupled to the second plurality of-- |
| Column 19, Line 61 | "common power supply node ; the" | --common power supply node, the-- |

Signed and Sealed this  
Nineteenth Day of August, 2025

Coke Morgan Stewart  
*Acting Director of the United States Patent and Trademark Office*